US006466056B1

(12) United States Patent
Greener

(10) Patent No.: US 6,466,056 B1
(45) Date of Patent: Oct. 15, 2002

(54) WIDE DYNAMIC "NOR" GATE

(75) Inventor: James R. Greener, Ft. Collins, CO (US)

(73) Assignee: Hewlett-Packard Company, Palo Alto, CA (US)

(*) Notice: Subject to any disclaimer, the term of this patent is extended or adjusted under 35 U.S.C. 154(b) by 0 days.

(21) Appl. No.: 09/798,414

(22) Filed: Mar. 2, 2001

(51) Int. Cl.[7] .................... H03K 19/096; H03K 19/094
(52) U.S. Cl. ........................................ 326/98; 326/112
(58) Field of Search .......................... 326/93, 95, 98, 326/112–114, 119; 365/203

(56) References Cited

U.S. PATENT DOCUMENTS 5,258,666 A * 11/1993 Furuki ........................ 326/106
5,867,049 A * 2/1999 Mohd ......................... 327/200
6,292,818 B1 * 9/2001 Winters ....................... 708/671

* cited by examiner

*Primary Examiner*—Michael Tokar
*Assistant Examiner*—James H Cho
(74) *Attorney, Agent, or Firm*—Alexander J. Neudeck

(57) ABSTRACT

A dynamic wide NOR gate with improved precharge node capacitance and leakage. This improves speed for many applications. Two precharge nodes are used instead of one. During the evaluate phase of the dynamic gate, the state of the two precharge nodes may be changed by a number of pulldown FETs. The state of these two precharge nodes are combined by a logic function that is enabled during the evaluate phase of the gate to produce a signal that is latched to produce the wide NOR gate output. This latched signal is also used to provide feedback to the precharge nodes to keep them from discharging due to parasitic effects such as the leakage current.

5 Claims, 1 Drawing Sheet

WIDE DYNAMIC "NOR" GATE

FIELD OF THE INVENTION

The present invention relates generally to circuits used in VLSI integrated circuits, and, more particularly to a dynamic NOR gate with a large number of inputs.

BACKGROUND OF THE INVENTION

Dynamic logic gates are often used in the design of logic circuits that require high performance and minimal size. Dynamic logic gates are much faster than static logic gates, but suffer from increased noise and susceptibility from fabrication process variation. Essentially, a dynamic logic gate is a circuit which requires a periodic electrical precharge, or refresh, such as with a dynamic random access memory (DRAM), in order to maintain and properly perform its intended logic function. Once the electrical precharge on the dynamic logic gate has been discharged, the dynamic logic gate can perform no other logic functions until subsequently precharged.

One such dynamic logic circuit performs a logical NOR function on a large number of inputs, often eight or more. This may be called a "wide NOR" gate. To perform this function, each of a large number of input lines are each connected to a single one of the gates of an equal number of input pulldown field-effect-transistors (FETs). The drains of each of these input FETs are all connected to a common, precharged, node. The precharged node is also connected to a transparent latch circuit known as a "zero catcher". In operation, if any of the input lines turns on any of the input FETs, it discharges the precharged node. This discharged state trips the zero catcher causing the output of the zero catcher to change state.

Unfortunately, as FET geometry's shrink, leakage currents increase. Leakage currents are also a greater problem when the circuits are fabricated using silicon-on-insulator (SOI) processes. These increased leakage currents increase the size of precharge FETs and holder FETs. This may decrease the speed of the overall wide NOR circuit. Accordingly, there is a need in the art for an improved dynamic wide NOR gate.

SUMMARY OF THE INVENTION

The invention provides a wide NOR gate with improved precharge node capacitance and leakage. This improves speed for many applications. Two precharge nodes are used instead of one. During the evaluate phase of the dynamic gate, the state of the two precharge nodes may be changed by a number of pulldown FETs. The state of these two precharge nodes are combined by a logic function that is enabled during the evaluate phase of the gate to produce a signal that is latched to produce the wide NOR gate output. This latched signal is also used to provide feedback to the precharge nodes to keep them from discharging due to parasitic effects such as the leakage current. Accordingly, for the same number of input lines, each pulldown FET has to discharge approximately half the capacitance when compared to a single precharge node circuit. Also, either the number of pulldown FETs may be increased, or the size of the pulldown FETs decreased while maintaining approximately the same speed of operation.

Other aspects and advantages of the present invention will become apparent from the following detailed description, taken in conjunction with the accompanying drawings, illustrating by way of example the principles of the invention.

DETAILED DESCRIPTION OF THE PREFERRED EMBODIMENTS

Figure 1:
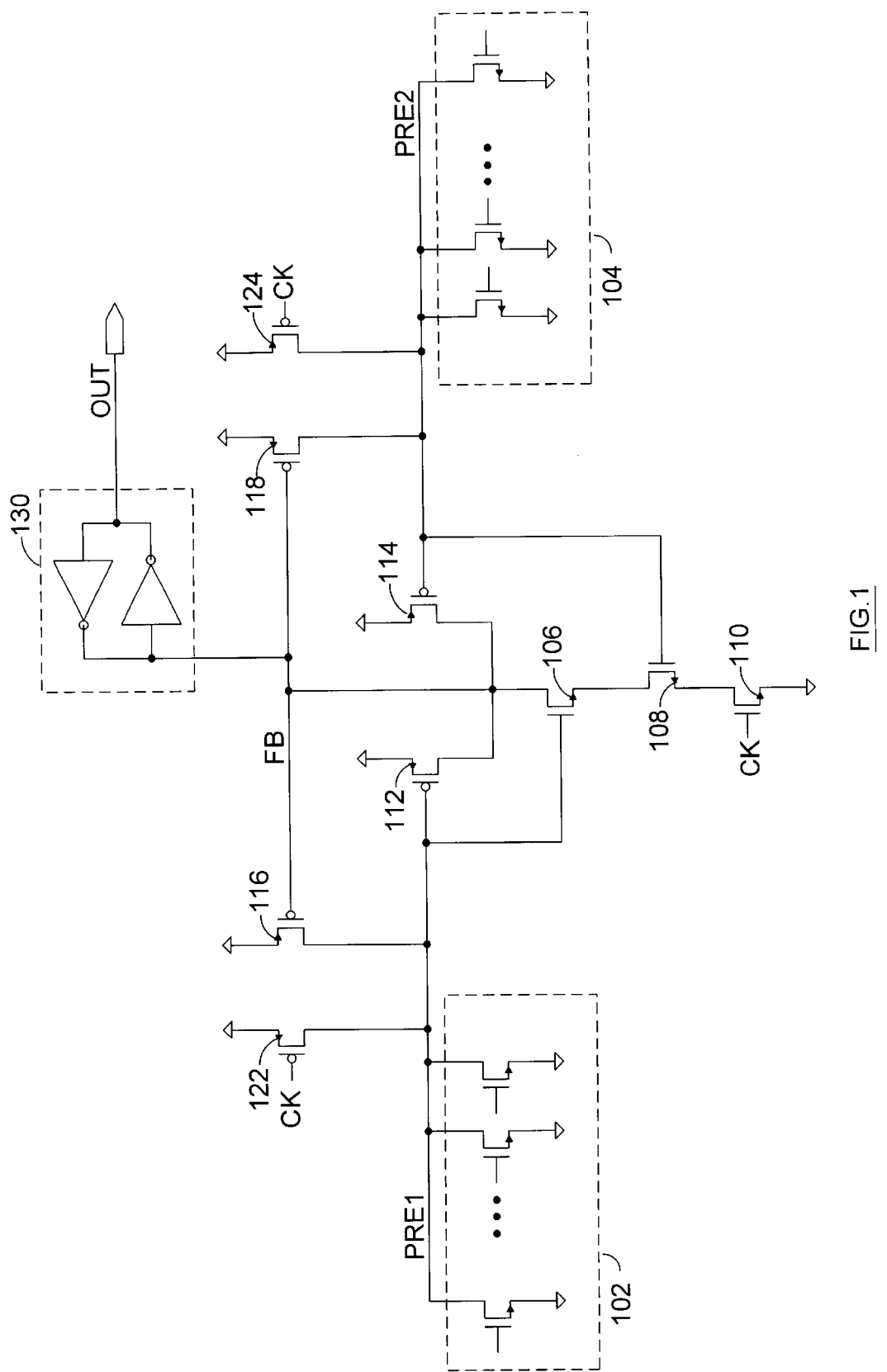
FIG. 1 is schematic illustration of a split precharge node wide NOR gate.

FIG. 1 is schematic illustration of a split precharge node wide NOR gate. In FIG. 1, nodes PRE1 and PRE2 are precharge nodes. These nodes are precharged by p-channel field effect transistors (PFETs) 122 and 124, respectively. The precharging of these nodes in controlled by the signal CK. When CK is low, PFETs 122 and 124 are on. This precharges nodes PRE1 and PRE2 respectively to approximately the positive supply voltage (VDD). The sources of PFETs 122 and 124 are connected to VDD. The gates of PFETs 122 and 124 are connected to CK. The drain of PFET 122 is connected to PRE1. The drain of PFET 124 is connected to PRE2.

When CK is high, nodes PRE1 and PRE2 are weakly held high by holder PFETs 116 and 118, respectively. These holder PFETs may be overdriven by any of the pulldown NFETs shown inside boxes 102 and 104.

A pulldown NFET inside box 102, when on, overpowers holder PFET 116 and discharges node PRE1 pulling it down to a logical low. Each NFET inside of box 102 has its source connected to the negative supply voltage (GND) and its drain connected to node PRE1. The gates of each of the respective NFETs inside box 102 are each connected to an input signal that is to be dynamically NOR'd with the other input signals. Likewise, A pulldown NFET inside box 104, when on, overpowers holder PFET 118 and discharges node PRE2 pulling it down to a logical low. Each NFET inside of box 104 has its source connected to the negative supply voltage (GND) and its drain connected to node PRE2. The gates of each of the respective NFETs inside box 104 are each connected to an input signal that is to be dynamically NOR'd with the other input signals.

In a preferred embodiment, the number of pulldown NFETs connected to PRE1 102 are roughly equal to the number of pulldown NFETs connected to PRE2 104. This minimizes the maximum leakage current on either PRE1 or PRE2. However, other arrangements are possible. For example, most of the pulldown NFETs may be connected to PRE1 and only a few to PRE2 if PRE2 is highly capacitively loaded. This arrangement may improve the overall speed of the gate.

During the evaluate phase of the gate (i.e. when CK is high), the state of PRE1 and PRE2 are combined by a logic function implemented by FETs 106–110. The output of that logic function is node FB. FB is latched by latch 130. Latch 130 is formed by connecting the input and output of a first inverter to the output and input of a second inverter, respectively. The output of latch 130 is the output of the wide NOR gate, OUT. FB is also used to control holder PFETs 116 and 118. FB is connected to the gates of holder PFETs 116 and 118. The sources of holder PFETs 116 and 118 are connected to VDD. The drain of PFET 116 is connected to PRE1. The drain of PFET 118 is connected to PRE2.

FETs 106–106 combine the state of PRE1 and PRE2 to produce FB. PRE1 is connected to the gates of PFET 112 and NFET 106. PRE2 is connected to the gates of PFET 114 and NFET 108. CK is connected to the gate of NFET 110. The sources of PFETs 112 and 114 are connected to VDD. The drains of PFETs 112 and 114 are connected to FB. The drain of NFET 106 is also connected to FB. The source of NFET 106 is connected to the drain of NFET 108. The source of NFET 108 is connected to the drain of NFET 110. The source of NFET 110 is connected to GND.

In normal operation, the precharge phase of the gate is when CK is low and the evaluate phase of the gate is when CK is high. During the precharge phase of the gate, the input signals are all low. This prevents a drive fight between the pulldown NFETs 102, 104 and the precharge PFETs 122, 124.

During the evaluate phase of the gate, the state of the two precharge nodes PRE1 and PRE2 may be changed by a high level on any of the input signals causing a respective pulldown NFET 102, 104 to turn on. If at least one of the pulldown NFETs in 102 turns on, it pulls down PRE1 to a low level. If at least one of the pulldown NFETs in 104 turns on, it pulls down PRE2 to a low level.

If either PRE1 or PRE2 are low, the logic function implemented by FETs 106–114 pulls FB to a high level as like a NAND function. Also, because CK controls the gate of NFET 110 and NFET 110 is in series with NFETs 106 and 108, FB can only go low during the evaluate phase when CK is high.

FB is latched by latch 130 and is also used to provide feedback through holder PFETs 122 and 124 to hold PRE1 and PRE2 high, respectively, if none of the pulldown NFETs turns on. This keeps PRE1 and PRE2 from discharging due to parasitic effects such as the leakage current. Because there are two precharge nodes instead of one, for the same number of input lines, each pulldown FET has to discharge approximately half the capacitance when compared to a single precharge node circuit. Also, either the number of pulldown FETs may be increased, or the size of the pulldown FETs decreased while maintaining approximately the same speed of operation.

Although a specific embodiment of the invention has been described and illustrated, the invention is not to be limited to the specific forms or arrangements of parts so described and illustrated. The invention is limited only by the claims.

What is claimed is:

1. A dynamic NOR gate, comprising:
   a first precharge node and a second precharge node combined by a NAND function thereby reducing the amount of leakage current drawn from each of said first precharge node and said second precharge node wherein a first NAND function output is latched and wherein said first NAND function output is inverted to produce an output of said dynamic NOR gate.

2. The dynamic NOR gate of claim 1 wherein said first precharge node and said second precharge node are connected to approximately a same number of pulldown devices.

3. A dynamic gate, comprising:
   two precharge nodes each connected to a plurality of pulldown devices thereby reducing effects of leakage currents on said precharge nodes;
   a NAND function that combines the state of said two precharge nodes to produce a first feedback signal that is used to control holder devices wherein said holder devices counteract said effects of leakage currents on said precharge nodes; and,
   a latch that latches said first feedback signal and buffers said feedback signal to produce an output that is a NOR function of a set of input signals.

4. The dynamic gate of claim 3 wherein said input signals control a set of pulldown devices that have leakage currents and each of said pulldown devices may pulldown one of said precharge nodes during an evaluate phase.

5. A method of reducing leakage current effects and load effects of a dynamic OR gate, comprising:
   precharging two precharge nodes, each of said two precharge nodes having approximately the same leakage current effects and load effects;
   combining the state of said two precharge nodes with a logic function;
   latching an output of said logic function wherein said output of said logic function is a NOR of a set of input signals; and,
   pulling down at least one of said precharge nodes with a pulldown device that is a member of a set of a plurality precharge devices, each of said set of said plurality of precharge devices adding leakage current and load to at least one of said precharge nodes.

* * * * *